US 10,504,695 B2

(12) United States Patent
Blackburn

(10) Patent No.: US 10,504,695 B2
(45) Date of Patent: Dec. 10, 2019

(54) CHARGED PARTICLE BEAM DEVICE AND PHASE PLATE

(71) Applicant: HITACHI HIGH-TECHNOLOGIES CORPORATION, Tokyo (JP)

(72) Inventor: Arthur Malcolm Blackburn, Berkshire (GB)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/776,678

(22) PCT Filed: Dec. 25, 2015

(86) PCT No.: PCT/JP2015/086277
§ 371 (c)(1),
(2) Date: May 16, 2018

(87) PCT Pub. No.: WO2017/109948
PCT Pub. Date: Jun. 29, 2017

(65) Prior Publication Data
US 2018/0330916 A1    Nov. 15, 2018

(51) Int. Cl.
*H01J 37/26* (2006.01)
*H01J 37/073* (2006.01)

(52) U.S. Cl.
CPC .......... *H01J 37/263* (2013.01); *H01J 37/073* (2013.01); *H01J 2237/262* (2013.01); *H01J 2237/2614* (2013.01)

(58) Field of Classification Search
USPC ........................................ 250/311, 306, 307
See application file for complete search history.

(56) References Cited

U.S. PATENT DOCUMENTS

| 8,785,850 B2 | 7/2014 | Malac et al. |
| 2008/0202918 A1* | 8/2008 | Nagayama ............... H01J 37/26 204/192.11 |
| 2011/0133084 A1 | 6/2011 | Nagaoki et al. |
| 2011/0174971 A1 | 7/2011 | Malac et al. |
| 2014/0326876 A1 | 11/2014 | Buijsse et al. |

FOREIGN PATENT DOCUMENTS

| JP | 2010-086691 A | 4/2010 |
| JP | 2011-151019 A | 8/2011 |
| JP | 2014-216319 A | 11/2014 |

OTHER PUBLICATIONS

M. Malac, M. Beleggia, M. Kawasaki, P. Li, R.F. Egerton, Convenient contrast enhancement by a hole-free phase plate, Ultramicroscopy, 118 (2012) 77-89.
International Search Report for WO 2017/109948 A1, dated Mar. 22, 2016.

* cited by examiner

*Primary Examiner* — Kiet T Nguyen
(74) *Attorney, Agent, or Firm* — Volpe and Koenig, P.C.

(57) ABSTRACT

A charged particle beam device includes: a first charged particle source that generates first charged particles and irradiates a sample with the generated first charged particles; a phase plate that changes phases of the first charged particles in accordance with charged states of portions through which the first charged particles are transmitted; and a phase plate control system that controls the charging of the phase plate.

16 Claims, 20 Drawing Sheets

Section A - A'

CHARGED PARTICLE BEAM DEVICE AND PHASE PLATE

TECHNICAL FIELD

The present invention relates to a charged particle beam device and a phase plate used in the device.

BACKGROUND ART

In the related art, in a case in which a weak-phase object such as a biological sample is imaged using a transmission electron microscope (TEM), the contrast of an acquired image becomes weak due to a low spatial frequency component of the observed object. It is important to acquire high contrast from a low spatial frequency component for quickly identifying the range of protein coating in a biologically important organism or structure (an intra-cell composition, a virus, or the like).

In the related art, in the field of transmission electron microscopes, in order to enhance contrast, phase plates inserted into passages of electron beams have been developed. Typically, a phase plate is disposed in a back focal plane of a transmission electron microscope or at a conjugate position of the back focal plane and causes a phase difference to occur by changing the phase of an electron wave passing through an area in which the phase plate is present and the phase of an electron wave passing through the other areas. At the present, while there are various types of phase plates, there is a phase plate of a thin-film transmission type as one thereof.

A phase plate of the thin-film transmission type decreases the intensity of the whole image and introduces additional scattering into a passage of an electron beam. For this reason, a phase noise is induced. For a phase plate of such a type, thickness control of high precision (about 1 nm) is required at the time of manufacturing for achieving a desired phase shift. In addition, a phase plate of such a type is sensitive to a thickness change that may easily occur in accordance with carbon contamination or an excitation chemical change according to an electron beam that is in use.

A phase plate of the thin-film transmission type at the initial period includes an opening in the center area of the phase plate. However, the phase plate having such a structure has a defect of having a phase shift easily changing in accordance with contamination or defects of a surface of the thin film generated in manufacturing. In addition, the magnitude of the phase shift depends on the intensity and the time of incident electrons, and thus, the practical use of the phase plate becomes complicated. Some of such phenomena can be reduced by covering a support frame of the phase plate and the surface of the phase plate with a carbon coating film and further heating the phase plate. However, even by employing such a countermeasure, the temporal stability of the phase shift cannot be improved.

Thus, recently, as illustrated in FIG. 1, phase plates having no opening in the center portions thereof have been proposed (NPTLs 1 to 3). These phase plates have a principle that a non-scattering electron beam formed on a back focal plane of a transmission electron microscope causes a phase shift on a thin film of the phase plate. In an insulating surface layer covering upper and lower faces of the conductive thin film of the phase plate, a portion irradiated with a non-scattering electron beam is in a state in which electrons are insufficient due to secondary electron discharge. For this reason, in the insulating surface layer, a positively-charged area accompanying a negatively-charged area right below thereof is generated. Net charge of this center area generates local net electrostatic potential different from that of a peripheral area for electrons passing through such an area. As a result, phase differences are generated to be different for electrons passing through the center portion and the peripheral portion.

CITATION LIST

Non-Patent Literature

NPTL 1: M. Malac, M. Beleggia, M. Kawasaki, P. Li, R. F. Egerton, Convenient contrast enhancement by a hole-free phase plate, Ultramicroscopy, 118 (2012) 77-89.
NPTL 2: M. Malac, M. Beleggia, M. Kawasaki, R. F. Egerton, Charging of a hole-free thin film phase plate, U.S. Pat. No. 8,785,850 B2, National Research Council Of Canada & JEOL Ltd., 2014.
NPTL 3: B. Buijsse, R. S. Danev, Method of using a phase plate in a transmission electron microscope, Application US20140326876 A1, FEI Inc, 2014.

SUMMARY OF INVENTION

Technical Problem

However, in a phase plate of a type illustrated in FIG. 1, there are restrictions in the control and the stability of the phase shift. The present invention has been made in consideration of such technical problems and provides a technology for enhancing the controllability and the stability of a phase shift.

Solution to Problem

In order to solve the problems described above, the present invention, for example, employs configurations described in the claims. While this specification includes a plurality of means solving the problems, for example, there is provided "a charged particle beam device including: (1) a first charged particle source that generates first charged particles and irradiates a sample with the generated first charged particles; (2) a phase plate that changes phases of the first charged particles in accordance with charged states of portions through which the first charged particles are transmitted; and (3) a phase plate control system that controls the charging of the phase plate."

Advantageous Effects of Invention

According to the present invention, the controllability and the stability of a phase shift can be enhanced compared to a case of the related art. Objects, configurations, and effects other than the foregoing description will be apparent through description of the following embodiments.

DESCRIPTION OF EMBODIMENTS

Hereinafter, embodiments of the present invention will be described with reference to the accompanying drawings. However, the embodiments of the present invention are merely examples of the present invention and are not for the purpose of limiting the technical scope of the present invention.

(1) Embodiment 1

Figure 1:
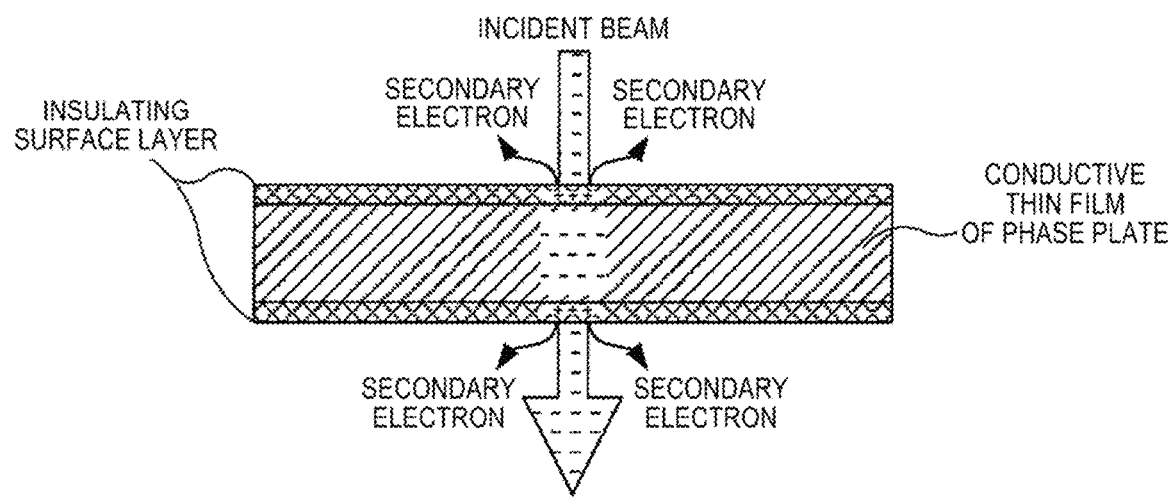
FIG. 1 is a view illustrating a phase plate of which a surface is covered with an insulating layer (a low conductivity layer) (technology in the related art).
Figure 2:
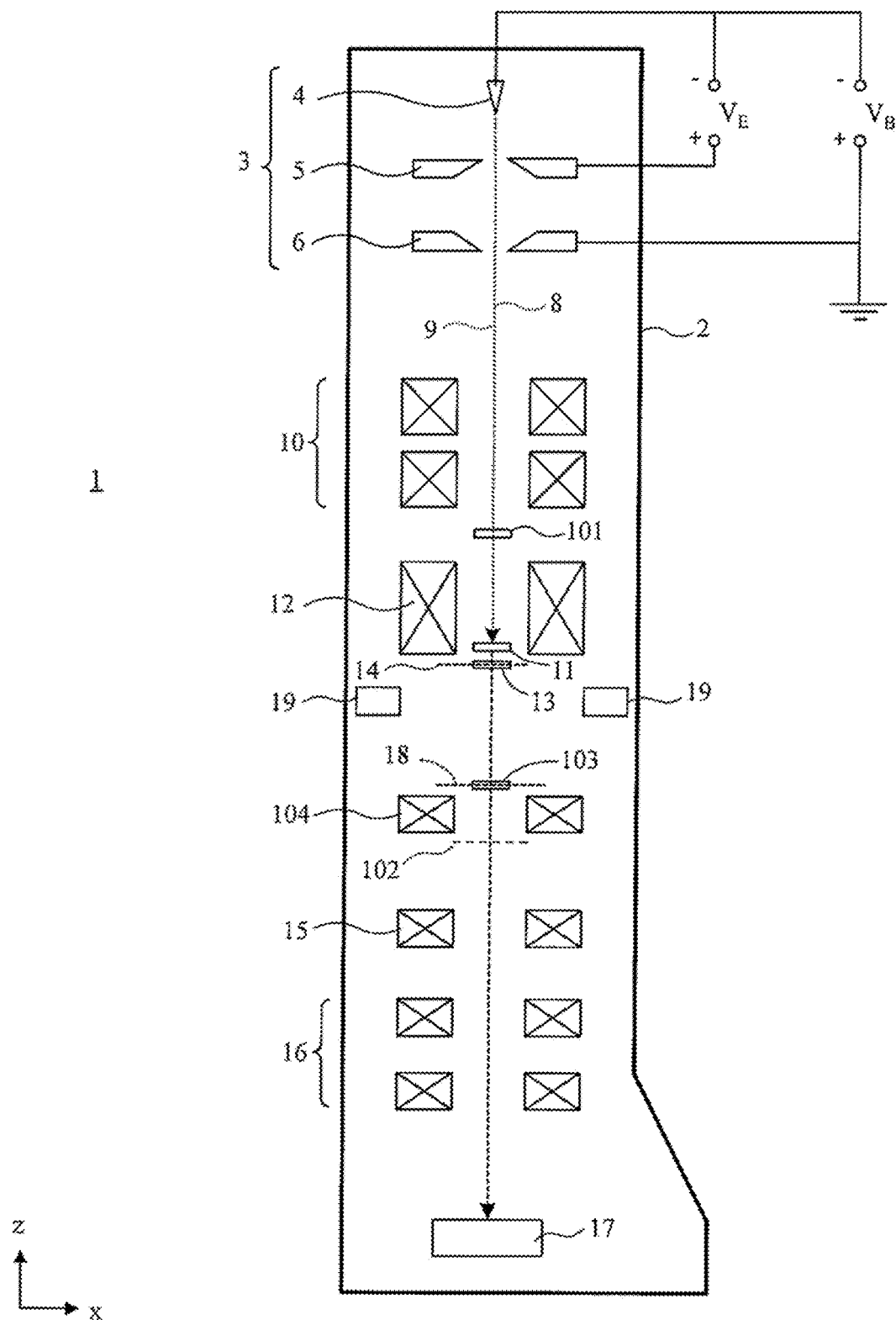
FIG. 2 is a view illustrating a configuration of an electron microscope according to Embodiment 1.

FIG. 2 illustrates the configuration of an electron microscope 1. In this embodiment, as the electronic microscope 1, a transmission electron microscope (TEM), a scanning transmission electron microscope (STEM), a scanning electron microscope (SEM), or the like is assumed. The electron microscope 1 includes a high-degree vacuum pump system not illustrated in the drawing or a housing 2 (generally, also called "column") connected to an ultra high-degree vacuum pump system. The housing 2 houses an electron source 3 including a cathode 4, a lead-out electrode 5, and an anode 6. A bias voltage $V_E$ is applied between the cathode 4 and the lead-out electrode 5. The cathode 4 generates an electron beam 8. A bias voltage $V_B$ (hereinafter, referred to as a "beam voltage") is applied between the cathode 4 and the anode 6. The beam voltage $V_B$ accelerates the electron beam 8. The beam voltage $V_B$ is used in a range of about 10 kV to 1 MV and, typically, a range of about 60 kV to 300 kV.

The electron beam 8 moves along an optical axis 9 and sequentially passes through an irradiation lens 10, an irradiation diaphragm 101, a sample 11, an objective lens 12, a phase plate 13 placed near a back focal plane 14 or near a conjugate plane 102 of the objective lens 12, a selected diaphragm diffraction 103, a diffraction lens 104, an intermediate lens 15, and a projection lens 16. Finally, the electron beam 8 is incident to a detector 17, and a projection image of the sample 11 is detected. The sample 11 that is a measurement target can be detachably attached to the electron microscope 1. In FIG. 2, from restrictions of drawing, several elements (particularly, a deflection coil and a correction coil) are not illustrated.

On the periphery of the phase plate 13, a phase plate control system 19 including one or both of an electron source and a photon source is disposed. In the drawing, while two phase plate control systems 19 are disposed, the number thereof is arbitrary. The phase plate control system 19 irradiates the phase plate 13 with one or both of an electron beam and a photon flux and generates a desired phase difference in an electron beam 8 passing through the phase plate 13. Hereinafter, an electron beam or a photon flux generated by the phase plate control system 19 will be referred to as a "phase plate control beam," and an electron beam 8 generated by the electron source 3 will be referred to as an "imaging beam" to be differentiated therefrom. The energy of the phase plate control beam is set to a value that is quite lower than that of the energy of the imaging beam.

In addition, the energy width of a photon flux generated by the phase plate control system 19 is typically set 0.5 to 10 eV.

The phase plate 13 according to this embodiment includes at least two areas, and the two areas have characteristics of being charged at different ratios according to an energy change (a change in the electron yield or a change in the work function of the photon flux) of the phase plate control beam and having a conductive property changing in accordance with excitation of carriers above a band gap of a semiconductor material according to the passage or the incidence of the phase plate control beam.

The phase plate control system 19 controls charging of the two areas described above by changing the energy or the intensity of the phase plate control beam irradiated to the phase plate 13. A change in the energy or the intensity of the phase plate control beam, for example, can be performed using time modulation of an electron source or a photon source (for example, a continuous pulse train that is pulse-width modulated). By irradiating two areas with the time-modulated phase plate control beam, an average charging level of each area changes (an electric potential changes), and, as a result, a phase difference between image beams passing through the two areas is generated. The phase plate control beam has little influence on the detection using the detector 17 and only acts on the adjustment of a phase difference between the two areas. In other words, the phase plate control beam acts only on a change or emphasis of the image contrast.

Figure 3:
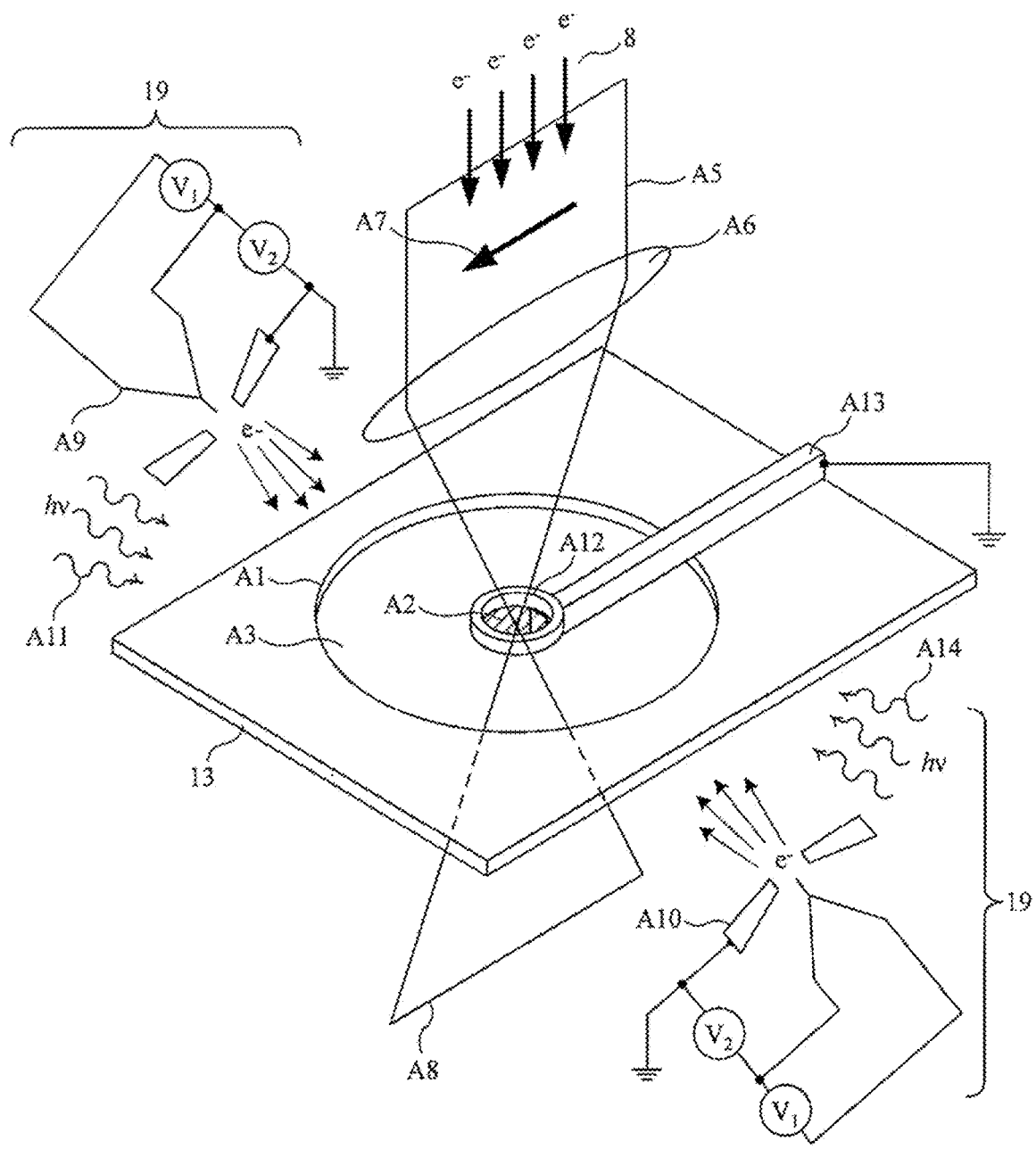
FIG. 3 is a view illustrating an example of arrangement of a phase plate (Configuration 1) and a phase plate control system according to Embodiment 1.
Figure 4:
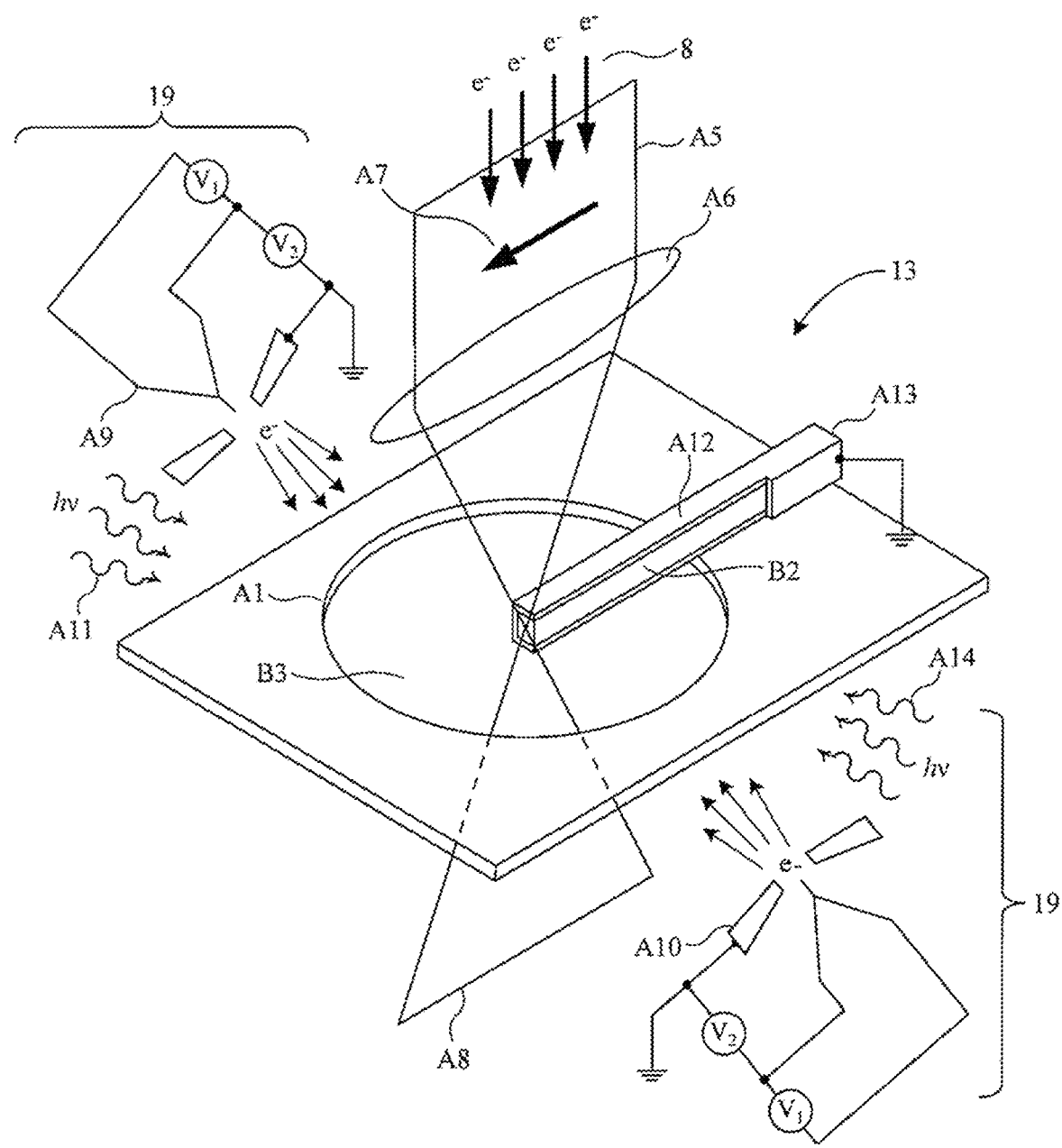
FIG. 4 is a view illustrating an example of the arrangement of a phase plate (Configuration 2) and the phase plate control system according to Embodiment 1.

FIGS. 3 and 4 illustrate a representative configuration of the phase plate 13 and the position relation of the phase plate control system 19. The phase plate 13 has a main body member having a flat plate shape. The phase plate 13, for example, is disposed at a back focal plane of a transmission electron microscope, an irradiation diaphragm position of a scanning transmission electron microscope or a scanning electron microscope, or a position equivalent thereto. In the main body member, an area A1 used for controlling the phase is disposed. The area A1 includes a first area (a center area A2 or B2) and a second area (a peripheral area A3 or B3). The first area and the second area are formed with members of which at least components or kinds of materials are different. One of the first area and the second area may be an opening. In the case of the phase plate 13 illustrated in FIGS. 3 and 4, the peripheral areas A3 and B3 are formed as openings near the center of the main body member. Each of the peripheral areas is an opening and thus does not have a constituent member thereof and has a function of generating different charging states between the center area A2 (or B2) and the peripheral area A3 (or B3). In other words, two areas of which the charging states are different from each other are generated within the plane of the phase plate 13. In the first area and the second area, the electron intensity or the accumulated amount of irradiation of the imaging beam (the electron beam 8) is different.

In a case in which the phase plate 13 is disposed at the back focal plane, the electron beam 8 passes through an objective lens A6 (the objective lens 12), then advances to a space interposed by an outer orbit A5 formed on the back focal plane, and forms an image of an object point A7 on an imaging plane A8 positioned on the downstream side of the phase plate 13. In this case, the main body member having a flat plate shape regulating an outer edge of the peripheral area A3 (or B3) is unnecessary. For example, in the case illustrated in FIG. 3, the phase plate 13 may include only a center area A2 disposed on the passage of an imaging beam (the electron beam 8), a conduction member A12 having a ring shape "confining a field" in the center area A2, and a support member A13 supporting the conduction member A12. By disposing the phase plate 13 at an upper opening position, the intensity and the phase distribution of an electron probe scanning the periphery of a sample plane can be controlled.

The phase plate control system 19 illustrated in FIGS. 3 and 4 includes both electron sources A9 and A10 and photon sources A11 and A14. For this reason, the phase plate control system 19 irradiates the phase plate 13 with both a second electron beam having relatively low energy and a photon flux. The sample 11 and the phase plate 13 may be continuously irradiated with an imaging beam (the electron beam 8) and a phase plate control beam (the second electron beam and the photon flux), or may be irradiated with a phase plate control beam that is pulse sequence modulated or pulse sequence modulated in an overlapping manner with respect to an imaging beam (the electron beam 8) continuously irradiated.

Hereinafter, it will be described that the phase plate 13 supports the formation of an image in which the intensity of a phase change inside the sample 11 is emphasized. In the case illustrated in FIG. 3, at least one of the center area A2 and the peripheral area A3 is irradiated with a phase plate control beam, and a relative electrostatic potential with respect to the grounding electric potential of the electron microscope 1 is generated. For this, materials of one or both of the center area A2 and the peripheral area A3 are not complete conductors. In other words, one or both of the center area A2 and the peripheral area A3 is formed of thin insulators, semi-insulators, or semiconductor materials. The center area A2 and the peripheral area A3 are formed of materials having different charging characteristics.

Inside the electron microscope 1, the imaging beam (the electron beam 8) forms an image of an objective A7 on an imaging plane A8. For this reason, the imaging beam (the electron beam 8) that has passed through an objective lens A6 (the objective lens 12) is bound by the outer orbit A5. The phase plate control system 19 irradiates a single area (one of the center area A2 and the peripheral area A3) or both areas (both the center area A2 and the peripheral area A3) of the phase plate 13 with a phase plate control beam. One or a plurality of electron sources A9 and A10 may be disposed only the upper side or the lower side of the phase plate 13 or both the sides. The electron sources A9 and A10 provide electrons having kinetic energy lower than that electron source 3. The phase plate control system 19 controls the energy using a voltage $V_2$ by controlling the intensity using heating of a filament of a voltage $V_1$.

In the case illustrated in FIG. 3, the center area A2 and the peripheral area A3 are electrically separated from each other using the conduction member A12. The area A2 surrounded by the conduction member A12 having the ring shape is the "field confining" area. The conduction member A12 is attached to the main body member of the phase plate 13 using the support member A13. The support member A13 having a rod shape may have a conductive property and be connected to the grounded electric potential of the electron microscope 1. By connecting the support member A13 to the grounded electric potential, it supports the maintaining of "field confining" using the conduction member A12.

A center area B2 and a peripheral area B3 illustrated in FIG. 4 are equivalent to the center area A2 and the peripheral area A3 described above. While the center area A2 is disposed near the center of the area A1, the peripheral area B2 extends over the range of the area A1. In the case illustrated in FIG. 4, the center area B2 is defined as a member having a rectangular shape buried inside the conduction member A12 having the rod shape of which the cross-sectional shape is "U" (a shape of "C"). In addition, one end portion of the conduction member A12 is integrally held by a support member A13 having no conductive coating. Also in this case, an area surrounded by the conduction member A12 is a "field confining" area. In addition, in the case illustrated in FIG. 4, the peripheral area B3 is defined as a portion acquired by excluding the conduction member A12 and the center area B2 from the area A1.

The electron sources A9 and/or A10 are set to have energy $E_S$ that is much lower than energy $E_P$ (generally, $E_P$>10 keV) of the imaging beam (the electron beam 8). For this reason, although electrons irradiated from the electron sources A9 and/or A10 directly arrive at the detector 17, the energy is a detection threshold of the detector 17 disposed on the periphery of the imaging plane A8 or less.

By using the phase plate control system 19, the flow of electrons received by one or both of the center area A2 and the peripheral area A3 can be changed (in other words, a phase difference can be arranged) without changing imaging conditions of a main optical system and the lens A6. Accordingly, a relative amount of electric charge (in other words, charging) maintained on the center area A2 and the peripheral area A3 (or the center area B2 and the peripheral area B3) can be changed without changing imaging conditions set in accordance with current excitation of a magnetic lens.

Figure 5:
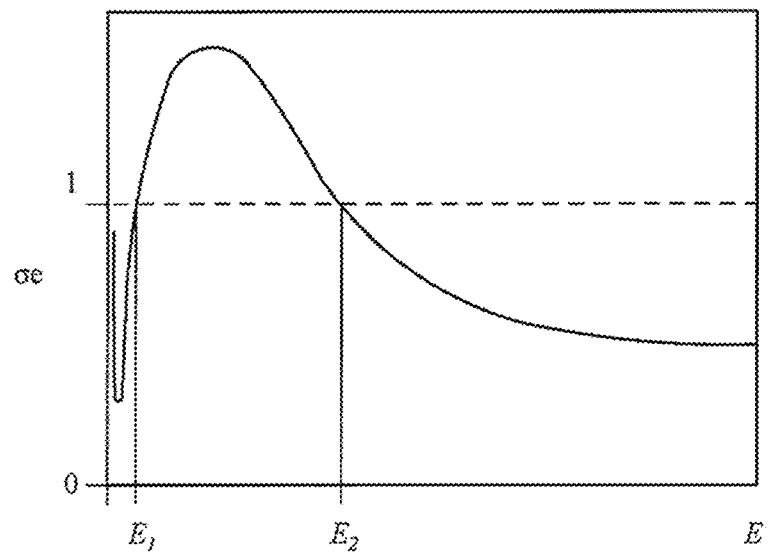
FIG. 5 is a diagram illustrating a secondary electron yield of a general material with respect to incident electron energy.

Description will be followed with reference to FIG. 5. In FIG. 5, the horizontal axis is energy, and the vertical energy is an electron yield σ. From FIG. 5, it can be understood that the electron yield σ is larger than "1" when $E_1$<E<$E_2$. This represents a possibility that the charging polarity of a partial area of the phase plate 13 can be changed when the energy $E_S$ of the phase plate control beam satisfies "$E_1$<$E_S$<$E_2$." In other words, it represents that the sign of the phase shift generated using static electric charge can be changed. In addition, since there is a large difference in the electron yield between materials near the energy $E_2$ or an area below the energy $E_2$, relative surface electric charge can be controlled. Here, the values of the energy $E_1$ and the energy $E_2$ are different for each material.

As described above, the configuration of the phase plate 13 according to this embodiment, as illustrated in FIGS. 3 and 4, is simple, and the manufacturing process thereof is simple. In addition, in the phase plate 13, an electric contact point other than that for grounding does not need to be arranged. Furthermore, in this embodiment, only by irradiating the surface of the phase plate 13 with the phase plate control beam using the phase plate control system 19, a phase difference between two areas can be controlled broadly and stably.

(2) Embodiment 2

Figure 6:
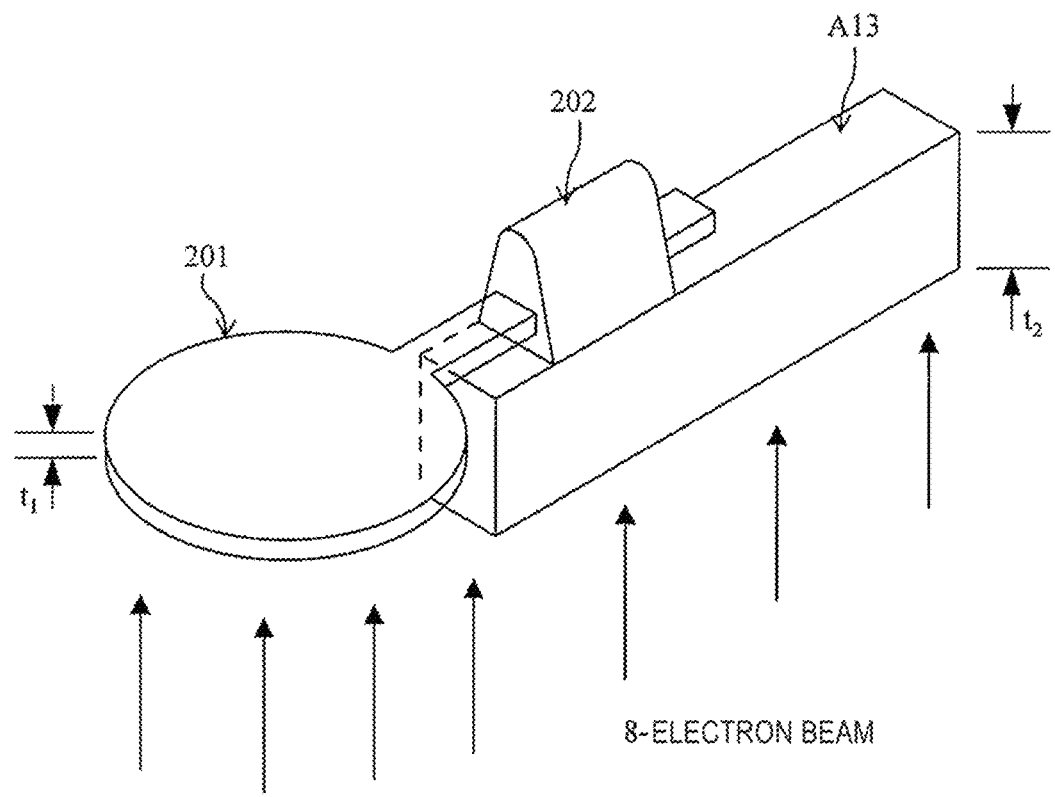
FIG. 6 is a view illustrating a configuration of a phase plate according to Embodiment 2.

Subsequently, an example of the configuration of the phase plate 13 will be described. FIG. 6 illustrates the configuration of a phase plate 13 used in this embodiment. The phase plate 13 according to this embodiment has a configuration in which a center disk 201 (corresponding to the center area A2) is connected to a support member A13 through a photoconductive member 202. In this case, a space disposed on the periphery of the center disk 201 is used as a second area (the peripheral area A3).

The center disk 201 includes a circular plate portion and an arm portion having a rod shape and is connected to the photoconductive member 202 using the arm portion. As a material having photoconductivity, an electron beam inducing deposits of $MoO_x$ formed from a mixture of $Mo(Co)_6$ and Oxygen is known. Other than that, a material having photoconductivity may be a material layer acquired using a different physical or chemical evaporation method (for example, ZnO deposited using an atomic layer deposition method). Here, the photoconductive member 202 is mounted in a portion of the support member A13 at which the imaging beam (the electron beam 8) does not arrive. For example, the photoconductive member 202 is disposed on a face of the support member A13 on an opposite side of a face to which the imaging beam (the electron beam 8) is incident. By using such a configuration, the photoconductive member 202 can be shielded from the imaging beam (the electron beam 8) to some degree.

The thickness $t_2$ of the support member A13 is set to a value for which electrons of a negligible number or a very small number are discharged from the irradiation face at the time of irradiation of the imaging beam (the electron beam 8). For example, in a case in which the imaging beam (the electron beam 8) has energy of 60 keV, the thickness $t_2$ of the support member A13 formed of W or Mo is set to 10 μm. The thickness of 10 μm is sufficient for shielding the photoconductive member 202 from the imaging beam (the electron beam 8).

In a shield area in which the photoconductive member 202 is arranged, an increase in the electron impact-induced conductivity induced by irradiation of the imaging beam (the electron beam 8) is reduced, and the conductivity of the area is sufficiently lower than saturation conductivity. In this way, the intensity of the phase plate control beam output from the phase plate control system 19 can be configured to be higher than that of a case in which at least a part of the photoconductive member 202 is not shielded from the imaging beam (the electron beam 8).

(3) Embodiment 3

Figure 7A:
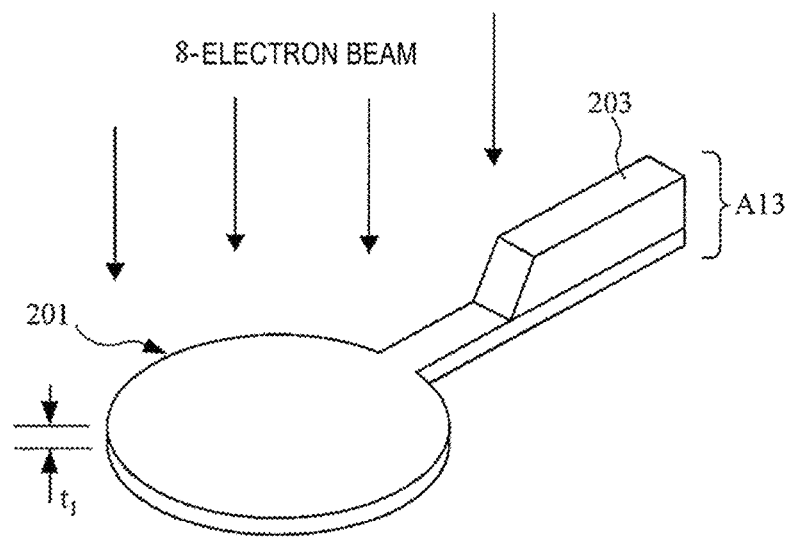
FIG. 7A is a view illustrating a configuration of a phase plate according to Embodiment 3.
Figure 7B:
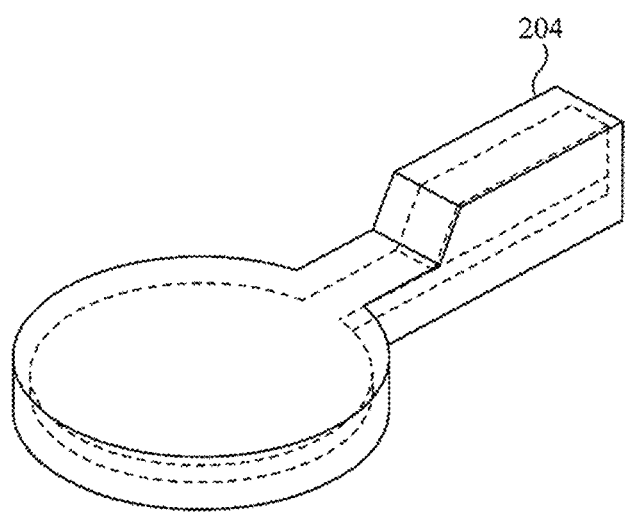
FIG. 7B is a view illustrating an external configuration of the phase plate according to Embodiment 3.
Figure 7C:
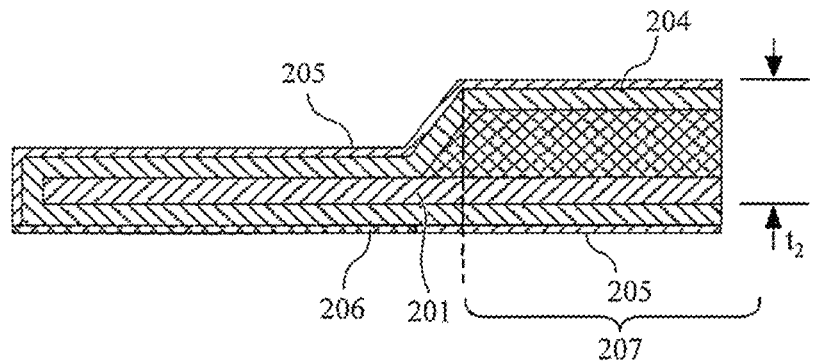
FIG. 7C is a view illustrating a cross-section configuration of the phase plate according to Embodiment 3.

Subsequently, another example of the configuration of a phase plate 13 will be described. FIGS. 7A to 7C illustrate the configuration of the phase plate 13 used in this embodiment. The phase plate 13 according to this embodiment has a configuration in which the surface of a center disk 201 (corresponding to the center area A2) is coated with a photoconductive member 204. A support member A13 may include a member 203 formed of one of a conductor or an insulator (for example, PT or $SiO_2$ acquired using the electron beam-induced evaporation). In FIGS. 7A to 7C, although the photoconductive member 204 covers the entire center disk 201, it may partly cover the center disk 201. In other words, the photoconductive member 204 may partly shield the center disk 201 from the imaging beam (the electron beam 8). For example, the imaging beam (the electron beam 8) may be shielded by absorbing the imaging beam (the electron beam 8) using the support member A13 having the thickness $t_2$, and a shield area 207 may be disposed on the side of the support member A13 not directly receiving the irradiation of the imaging beam (electron beam 8). Here, a scattering imaging beam (electron beam 8) passes through the thick shield area 207 having a large film thickness, and non-scattering imaging beam (the electron beam 8) passes through the area of the center disk 201.

The photoconductive material, for example, may include ZnO deposited using atomic layer deposition (ALD) or the like. Typically, the thickness of the photoconductive material is between 0.5 to 5 nm. The thickness may be determined in accordance with the required operation range of the phase plate 13. In addition, as illustrated in FIG. 7C, coatings 205 and 206 may be formed on the surface of the photoconductive member 204. The coatings 205 and 206 are formed by depositing an amorphous material (for example, a material having a small electron scattering cross-section similar to a conductive material such as carbon) through heating or electron beam deposition. In addition, the entire surface does not necessarily need to be coated with the coatings 205 and 206 using this conductive material, and only one side thereof may be coated.

(4) Description of Principle of Realizing Phase Shift

A thickness of an area (for example, the center area A2) forming the phase plate 13 and electrostatic potentials of the inner side and the outer side of each area relate to a phase shift of electrons passing through the phase plate 13. When the phase plate 13 is sufficiently thin, the average inner electric potential $\phi_I$ of materials forming the phase plate 13 and an electrostatic electric potential $\phi_E$ near the center disk 201 contribute to a phase shift. In other words, the average inner electric potential $\phi_I$ and the electrostatic potential $\phi_E$ have principled influences on a phase shift $\phi$ received by an electron wave passing through a structure body. Here, the phase shift $\phi$ is given as follows.

$$\phi = \sigma \Phi_I t_I + \sigma \int_{Zl}^{Zu} \Phi_E dz \quad \text{Equation (1)}$$

Here, "z" is a direction parallel to the imaging beam (the electron beam 8) and, generally, is vertical to the phase plate 13. "Zu" and "Zl" respectively correspond to the upper side and the lower side of z coordinates. Here, a contribution from specific $\phi_E$ is assumed to be negligible. In addition, "σ" is an interaction coefficient between electrons and is given as follows.

$$\sigma = \frac{2\pi m e \lambda}{h^2} \quad \text{Equation (2)}$$

Here, "m" is a mass of an electron, "e" is electric charge of an electron, and "h" is a Planck's constant, and "λ" is an electron wavelength. "λ" is given as follows.

$$\lambda = h\sqrt{2meV(1+eV/2me^2)} \quad \text{Equation (3)}$$

Here, V is an acceleration voltage supplied to an electron beam.

This electrostatic model can be used for estimating the electrostatic potential $\phi_E$ near the center disk 201 according to each embodiment described above. For example, in the phase plate 13 illustrated in FIG. 3, a case will be considered in which a center area A2 is formed of amorphous silicon, the diameter thereof is 2 μm, and the thickness thereof is 5 nm. In addition, a conductive material (for example, deposition Pt according to electron induced deposition (EBID)) forming a conduction member A12 having a ring shape is formed to surround the center area A2. Furthermore, an area A1 is assumed to be included in the electrostatic model, and a peripheral area A3 is vacuum. The main body member of the phase plate 13 formed of a conductive material is maintained at the grounding electric potential and, for example, is formed of a silicon plate having a thickness of 1 μm or more. In this electrostatic model, the diameter of the area A1 is 50 μm.

In this case, the center area A2 formed of amorphous silicon is estimated to have an average inner electric potential $\phi_I$ of 13.5 V, and a phase shift component according to the average inner electric potential $\phi_I$ corresponding to a first term of (Equation 1) is 0.16 π radian for an electron beam of 200 keV.

Here, the energy and the intensity of the phase plate control beam output by the phase plate control system 19 are adjusted such that the static electric potential of the center area A2 is set to an electric potential Vd (a center value of the phase shift $\phi$ is π/2). In the electrostatic modeling assuming the shape described above, electrostatic equipotential lines on an r-z plane of a case in which a conduction member A12 maintained at the grounding electric potential is not present as a boundary element are illustrated in FIG. 8, and electrostatic equipotential lines on the r-z plane of a case in which a conduction member A12 maintained at the grounding electric potential is present are illustrated in FIG. 9.

Figure 8:
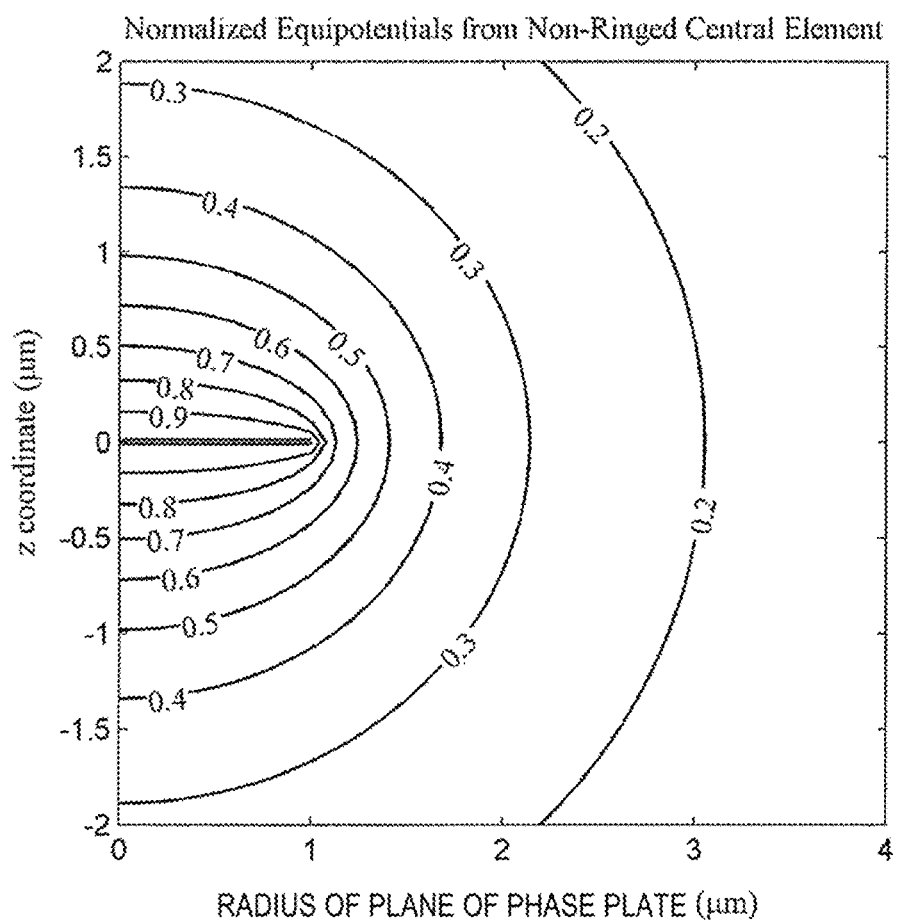
FIG. 8 is a diagram illustrating electrostatic equipotential lines of an r-z plane normalized using an assumed surface electric potential Vd of a center area A2 (a case in which a grounded conduction member A12 is not present as a boundary element).
Figure 9:
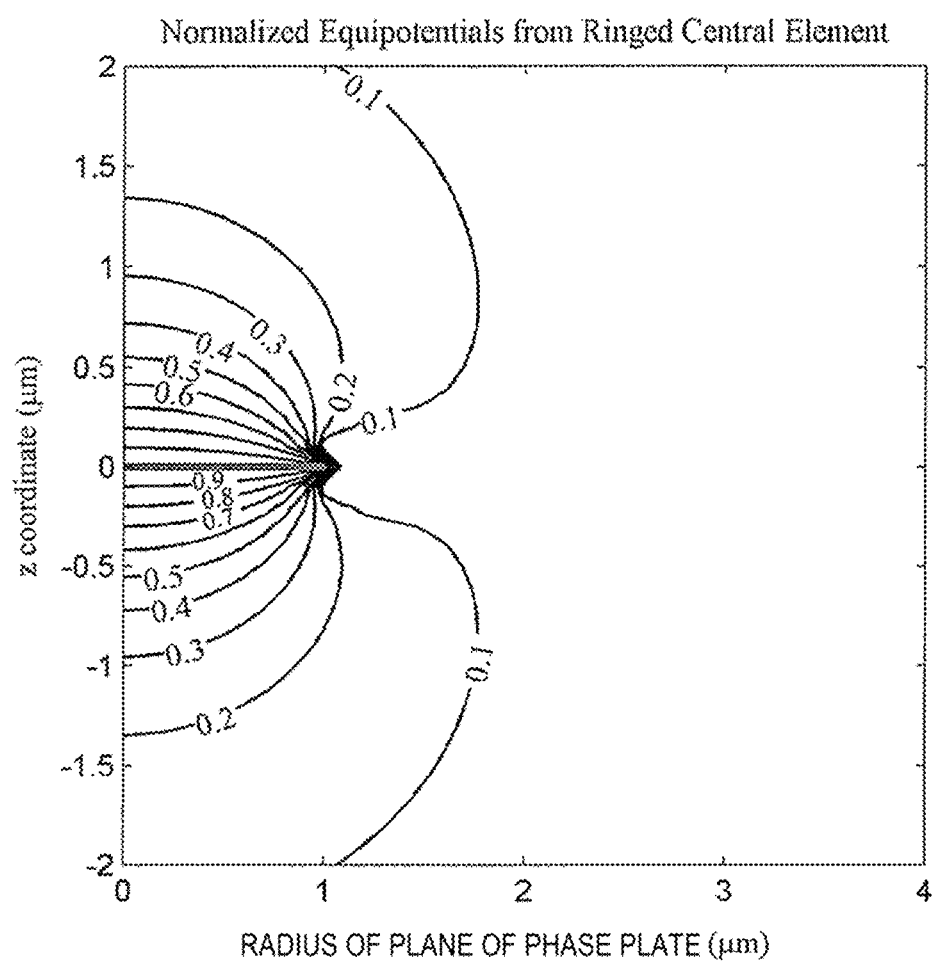
FIG. 9 is a diagram illustrating electrostatic equipotential lines of the r-z plane normalized using the assumed surface electric potential Vd of the center area A2 (a case in which the grounded conduction member A12 is present as a boundary element).
Figure 10:
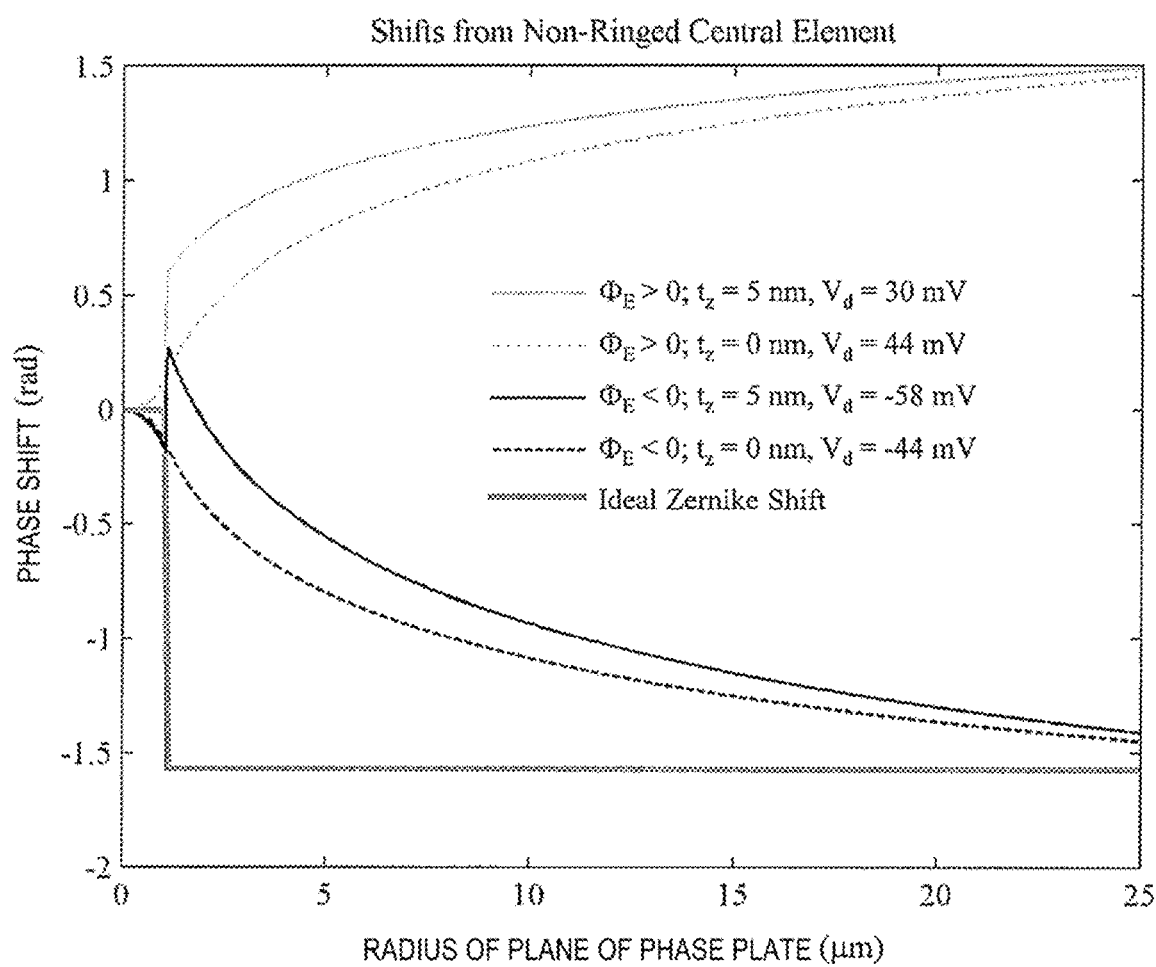
FIG. 10 is a diagram illustrating a phase shift on a phase plate plane in a radial direction (in a case in which a grounded conduction member A12 in a ring shape is not present).
Figure 11:
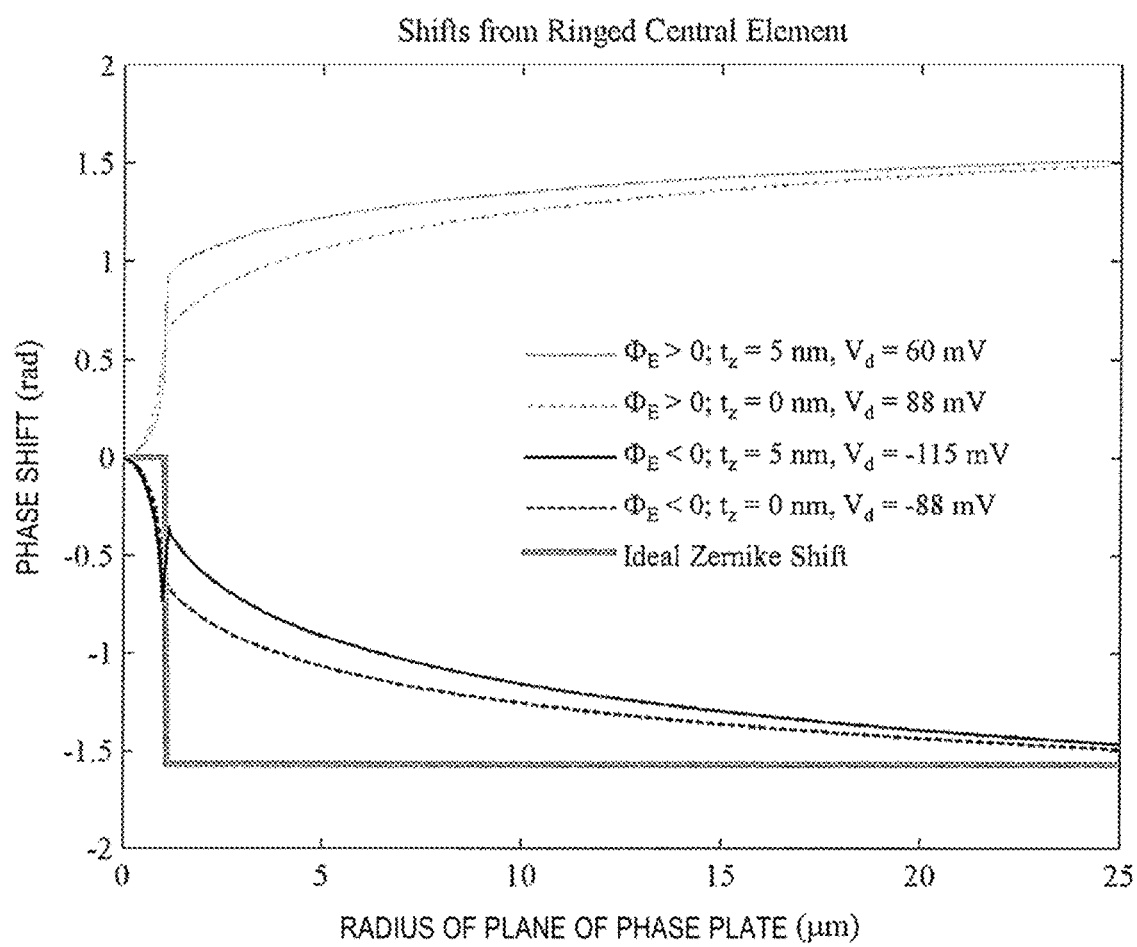
FIG. 11 is a diagram illustrating a phase shift on the plane the phase plate in the radial direction (in a case in which the grounded conduction member A12 in a ring shape is present).

A phase shift $\phi$ for each status illustrated in FIGS. 10 and 11 is calculated by referring to the characteristics illustrated in FIGS. 8 and 9. Here, the phase shift $\phi$ is offset such that $\phi=0$ is constantly given at r=0. In such diagrams, the surface electric potential Vd of the center area A2 from which a plot characteristic is to be acquired is also given. Generally, there is a small jump of the phase at the position of r=1 μm corresponding to the edge (outer edge) of the center area A2, and the magnitude of the phase shift gently falls or rises toward $|\phi|=\pi/2$ as the radius r becomes closer to r=25 μm (the outer edge of the area A1). In FIGS. 10 and 11, for comparison, also a case in which the thickness of the center area A2 is zero ($t_z=0$) is illustrated together with characteristics of an ideal Zernike phase plate for the same cutting-out radius.

Hereinafter, when the approximation of a phase contrast transfer function (PCTF) illustrating the contrast of the phase plate 13 with respect to the spatial frequency is represented using a combination of a phase shift $\phi$ representing spherical aberration and a defocus present in a transmission electron microscope, it is represented as below.

$$\gamma(k) = 2\pi(\tfrac{1}{4}C_S\lambda^3 k^4 - \tfrac{1}{2}\Delta z \lambda k^2) + \phi(k) \quad \text{Equation (4)}$$

Accordingly, the PCTF is given as follows.

$$G_C(k) = \sin(\gamma(k)) \quad \text{Equation (5)}$$

Figure 12:
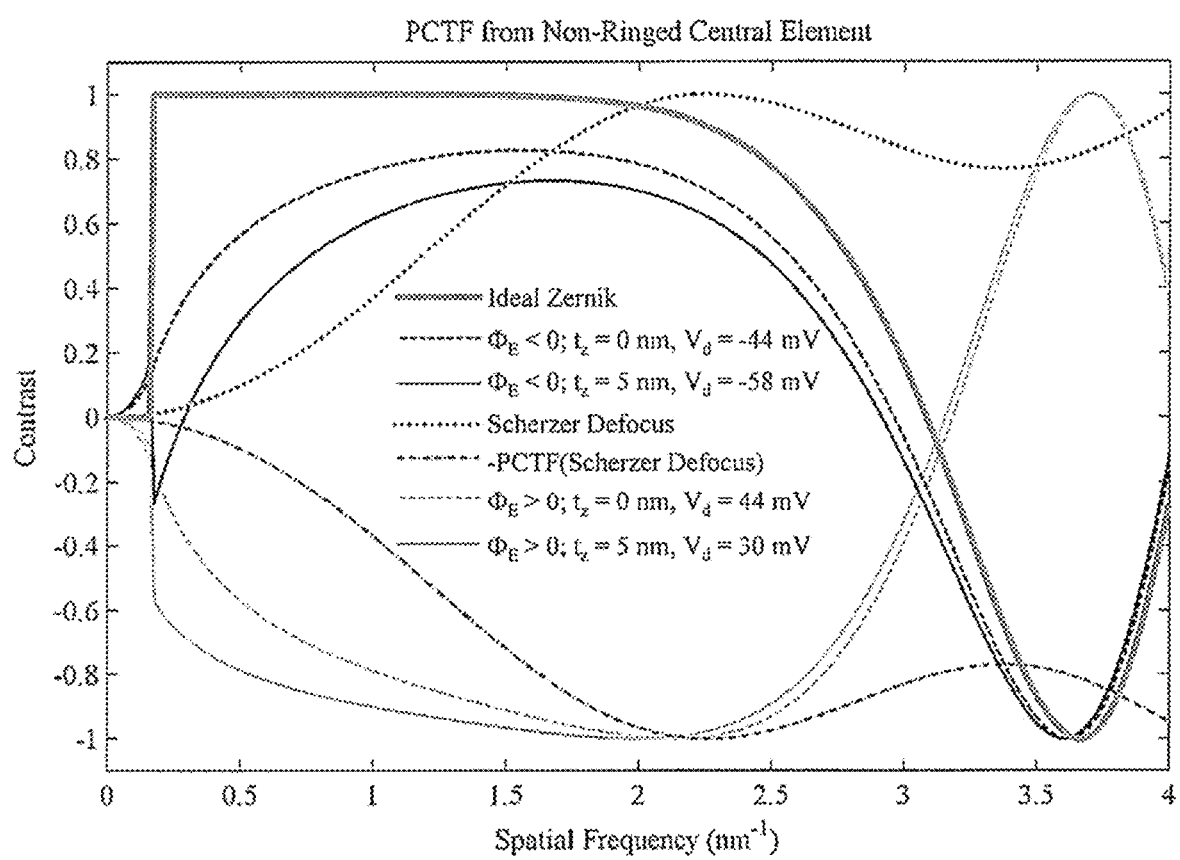
FIG. 12 is a diagram illustrating PCTF of a phase plate not having the grounded conduction member A12 in a ring shape and TEM characteristics of a Zernike phase plate.
Figure 13:
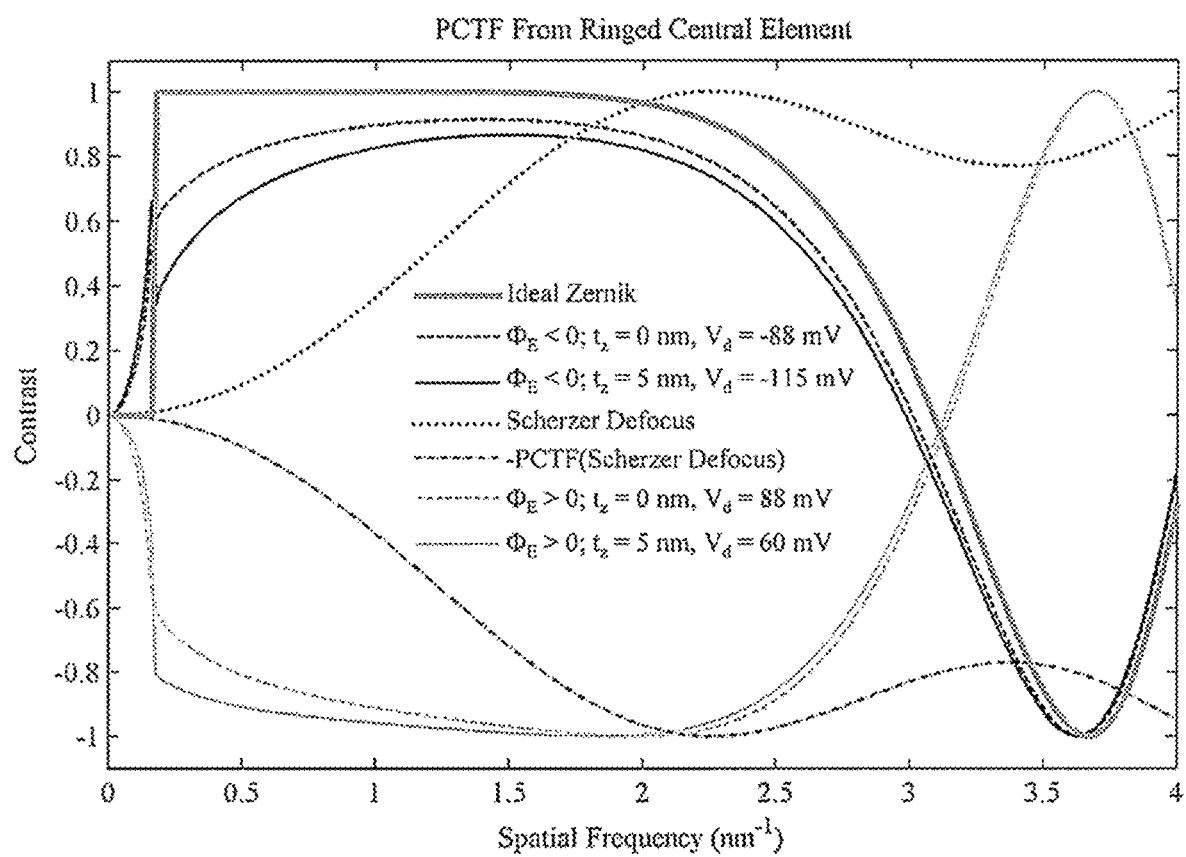
FIG. 13 is a diagram illustrating PCTF of the phase plate having the grounded conduction member A12 in a ring shape and the TEM characteristics of the Zernike phase plate.

Here, "k" is a spatial frequency and relates to a position r on the back focal plane in the radial direction through k=r/fλ. "f" is a focal distance of the objective lens, and "$C_S$" is a spherical aberration coefficient. When the PCTF is calculated for a transmission electron microscope operating at an acceleration voltage 200 keV with $C_S$=0.7 mm, characteristics plotted in FIGS. 12 and 13 are acquired. In FIGS. 12 and 13, a PCTF of a case in which a transmission electron microscope is operated under a Scherzer condition for which the contrast of a transmission electron microscope for a point phase object acquired through Equation (6) is the maximum is also plotted.

$$\Delta z_{sch} = 1.21\sqrt{C_S \lambda} \quad \text{Equation (6)}$$

In addition, in FIGS. 12 and 13, a PCTF of an ideal Zernike phase plate having a cutoff frequency that is equivalent to the radius of the center area A2 is also plotted.

From such diagrams, it can be understood that, by using the phase plate 13 according to the embodiment, compared to a case in which the phase plate 13 is not used, useful enhancement of the contrast at a low spatial frequency (less than 1.5 to 2 nm$^{-1}$) is provided. In some configurations for a low spatial frequency area, compared to a case in which the most general Zernike phase plate is mounted, in an area of a low spatial frequency at which the contrast is inverted, the contrast being negative for a certain setting represents being in correspondence with being displayed bright for a dark background in an area of a thick sample 11 having a larger phase shift and a bright background being darkened.

(5) Embodiment 4

In the embodiments described above, the electron microscope 1 including at least the center area A2 and the peripheral area A3 having an electrostatic surface electric potential modulated by the phase plate control beam irradiated separately from the imaging beam (the electron beam 8) has been described. In such embodiments, the surfaces of the center area A2 and the peripheral area A3 are positioned inside the housing 2 maintained to be vacuum, and the surface electric potentials generate an electric field and, furthermore, an electrostatic potential propagating in a peripheral space of a phase plate mechanism.

Meanwhile, by coating such areas with a thin conduction layer such as carbon, the modulation of the electrostatic potential can be limited to the inner side of the center area A2 and the peripheral area A3 (or the center area B2 and the peripheral area B3). As described above, such areas are semiconductors or partial insulators, and, by irradiating the area with the phase plate control beam output from the phase plate control system 19, a charging distribution is modulated, and the inner electric field and the electric charge distribution can be maintained. This, in this embodiment, the phase plate 13 is formed by covering the surfaces of two areas of which materials are different with a thin conduction layer, and a relative phase shift is assumed to be modulated between the areas of which the materials are different.

Figure 14A:
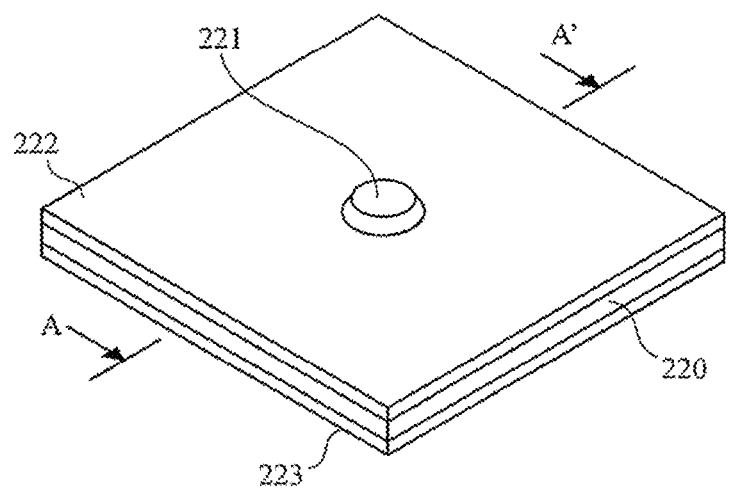
FIG. 14A is a view illustrating an external configuration of a phase plate according to Embodiment 4.
Figure 14B:
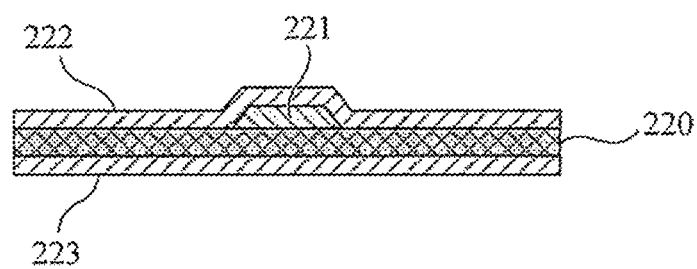
FIG. 14B is a view illustrating a cross-sectional configuration of the phase plate according to Embodiment 4.

FIGS. 14A and 14B illustrate configuration examples of a phase plate 13 according to this embodiment. Here, the phase plate 13 has a configuration in which thin conduction layers 222 and 223 are sequentially deposited on both faces of an amorphous silicon film 220 having a thickness of 5 nm through thermal deposition. The conduction layers 222 and 223, for example, include carbon having a thickness of 5 nm. The amorphous silicon film 220, similar to the phase plate 13 according to the embodiment described above, for example, is disposed at the back focal plane.

The amorphous silicon film 220 is a continuous film having an area equivalent to the area A1 (FIG. 3). In a part (for example, near the center) of the upper face of the amorphous silicon film 220, an island part 221 formed using a material different from amorphous silicon is formed. The island part 221, for example, is deposited using a deposited focusing electron beam induced from a gas-shaped precursor. The island part 221, for example, has a diameter of 1 to 2 μm and a thickness of 2 to 50 nm and may contain $MoO_x$ formed from a mixture of Oxygen and $Mo(Co)_6$ using EBID or SiOx formed from TEOS using EBID. $MoO_x$ has very high photoconductivity within a visible range. On the other hand, the photoconductivity of SiOx is limited. The island part 221 corresponds to the center area A2. Anyway, by simultaneously irradiating the imaging beam (the electron beam 8) and the phase plate control beam, the island part 221 and the amorphous silicon film 220 positioned on the periphery thereof can be charged with different electric potentials. In an EBID depositing process, the amount and the intensity of an electron beam received during deposition and the energy of the electron beam determine the thickness of an island-shaped depositing material.

(6) Embodiment 5

Figure 15A:
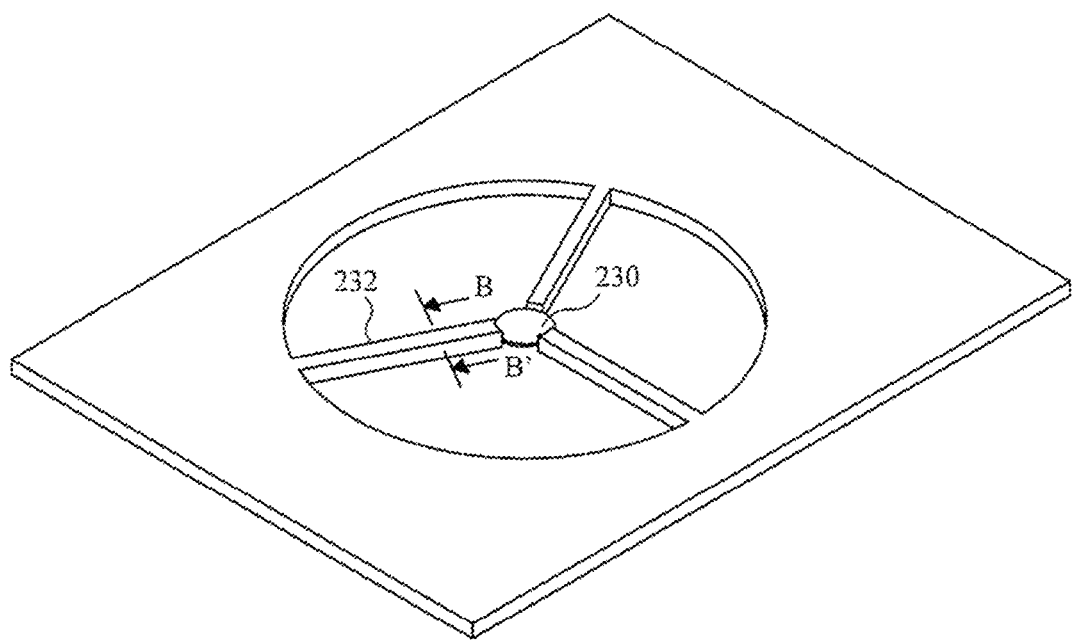
FIG. 15A is a view illustrating an external configuration of a phase plate according to Embodiment 5.
Figure 15B:
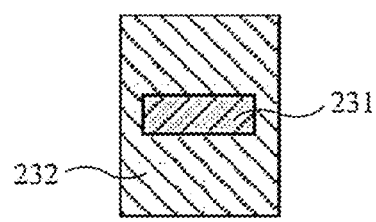
FIG. 15B is a view illustrating a partial cross-sectional configuration of the phase plate according to Embodiment 5.

In Embodiment 1 described above, as illustrated in FIGS. 3 and 4, although a case in which one support member A13 supports the center area A2 (the member A12) has been described, a plurality of support members may be present. FIGS. 15A and 15B illustrate a case in which three support members are present. These three support members, for example, can be initially formed by performing reactive ion etching of a low-conductive material 231 through an oxygen plasma removing mask exposed using photolithography. Thereafter, remaining parts (corresponding to three support members) of the low-conductive material 231 are coated with a conductive material 232 (for example, sputtering deposition of gold). Subsequently, the coating of a part corresponding to a center area 230 (corresponding to the center area A2) is removed using selective patterning of a focused ion beam. As a result, the low-conductive material 231 is exposed in the center area 230.

Figure 16:
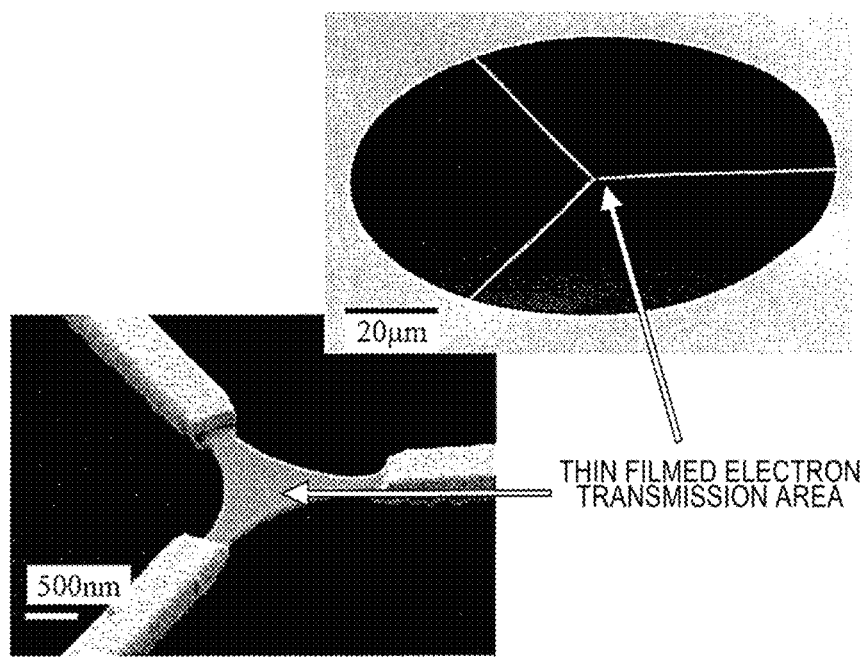
FIG. 16 is a view illustrating a SEM image of the phase plate according to Embodiment 5.
Figure 17A:
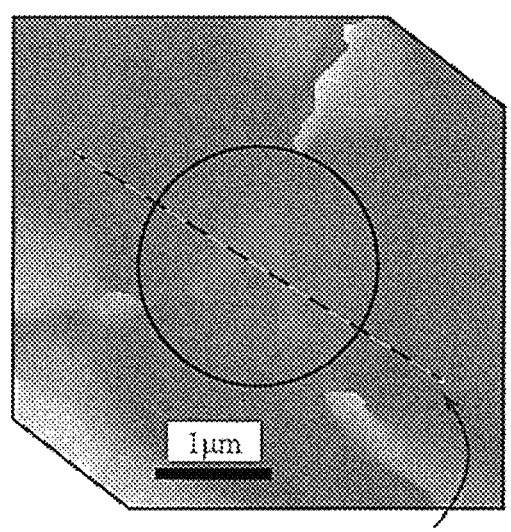
FIG. 17A is a view illustrating a phase shift on a center area of a phase plate.
Figure 17B:
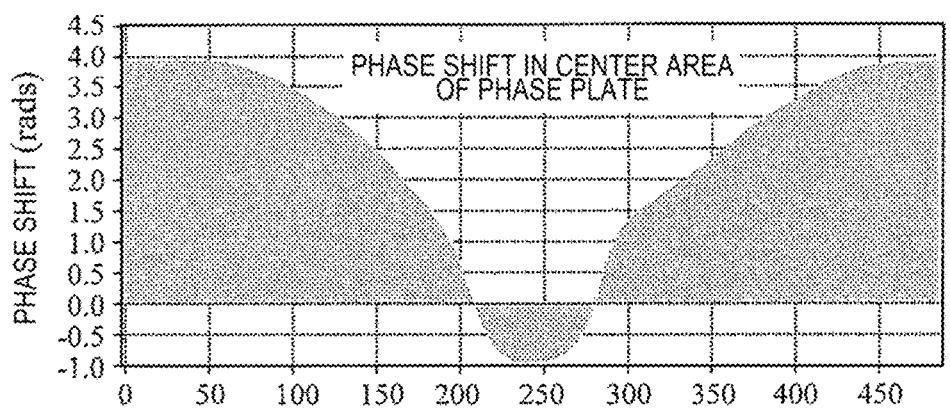
FIG. 17B is a diagram illustrating a line profile of a phase shift.

FIG. 16 illustrates an image acquired through observation of an area near the center area 230 of the phase plate 13 using a scanning electron microscope. In the case illustrated in FIG. 16, the shape of the center area 230 is an approximate triangle shape. FIGS. 17A and 17B are electron beam holography images of the center area 230. These images illustrate that a phase shift in an area surrounding the center area 230 is in a shape that is predicted from the result of the electrostatic model illustrated in FIG. 11. This illustrates that contrast can be emphasized when a low-phase object like ferritin is imaged. Imaging examples of ferritin are illustrated in FIGS. 18A to 18C.

Figure 18A:
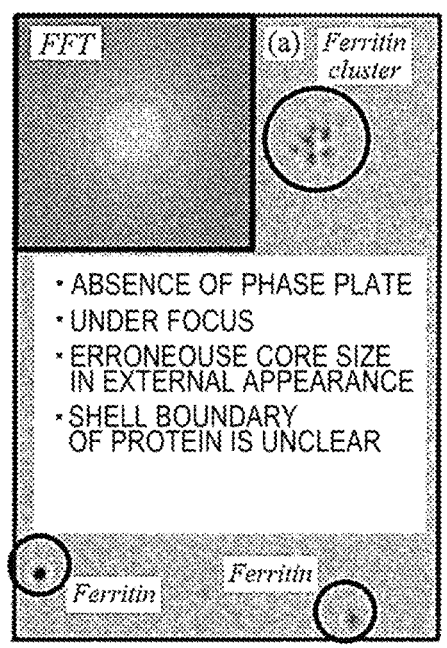
FIG. 18A is a view illustrating a transmission electron microscope image that is imaged in an under focus state without using a phase plate.
Figure 18B:
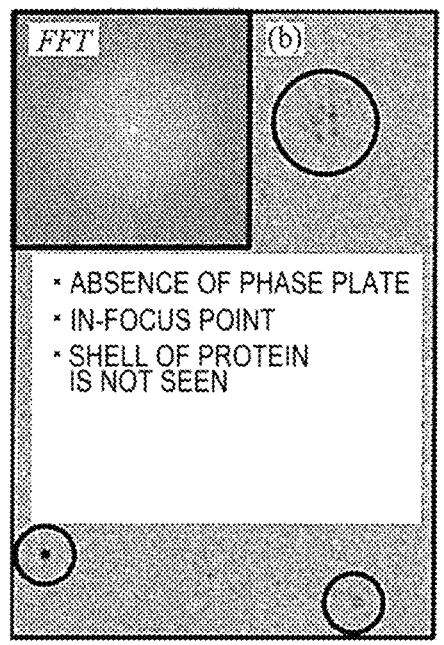
FIG. 18B is a view illustrating a transmission electron microscope image that is imaged in a focus state without using a phase plate.
Figure 18C:
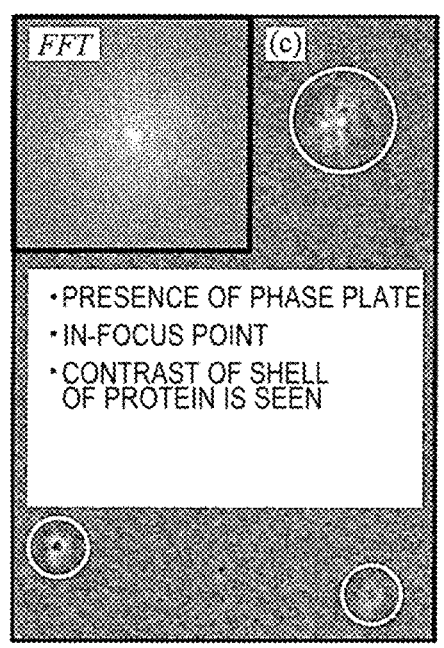
FIG. 18C is a view illustrating a transmission electron microscope image that is imaged in a focus state using a phase plate.

FIG. 18A is an image acquired by performing imaging under an under-focus condition with no phase plate. In the case of the image illustrated in FIG. 18A, ferritin represents an erroneous core size in external appearance, and a shell boundary of protein is unclear. FIG. 18B is an image acquired by performing imaging under an in-focus condition with no phase plate. In the case of the image illustrated in FIG. 18B, the shell of protein is not seen. FIG. 18C is an image acquired by performing imaging in an in-focus state using a phase plate 13 according to an embodiment. In the case of the image illustrated in FIG. 18C, contrast is given to a core and a shell (a white portion on the periphery of a black point) of protein. In any one of the cases illustrated in FIGS. 18A to 18C, on an FFT illustrated on the upper left corner, a support structure body and a star-shaped artifact occurring in accordance with non-rotating invariable charging are generated. In a case in which the phase plate 13 having the structure illustrated in FIG. 3 or 15A is used, the number of symmetrical sequences can be decreased in accordance with the number of support members A13, and the property of the artifact appearing on the TFT can be changed.

Figure 19A:
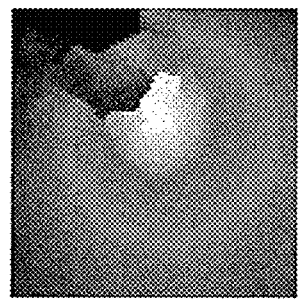
FIG. 19A is a view illustrating a phase image that is imaged without UV irradiation.
Figure 19B:
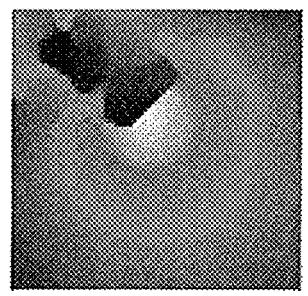
FIG. 19B is a view illustrating a phase image that is imaged with UV irradiation.
Figure 19C:
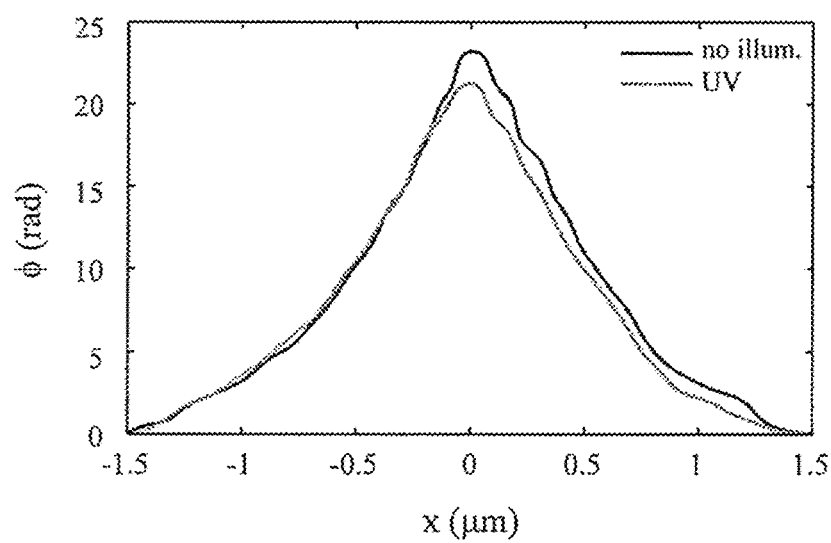
FIG. 19C is a diagram illustrating a profile of a phase shift.

FIGS. 19A to 19C illustrate test results proving charging of an insulator in accordance with irradiation of UV light. Such diagrams illustrate phase images according to small insulating particles present near the center of an observation field. FIG. 19A illustrates a phase image that is acquired by performing imaging with absence of UV irradiation, and FIG. 19B is a phase image that is acquired by imaging with presence of UV irradiation. FIG. 19C illustrates a profile of a phase shift. The profile is acquired in a peak area of the phase shift in a phase image. FIG. 19C illustrates that a phase shift is modulated (decreased in this example) using UV irradiation.

(7) Embodiment 6

Figure 20:
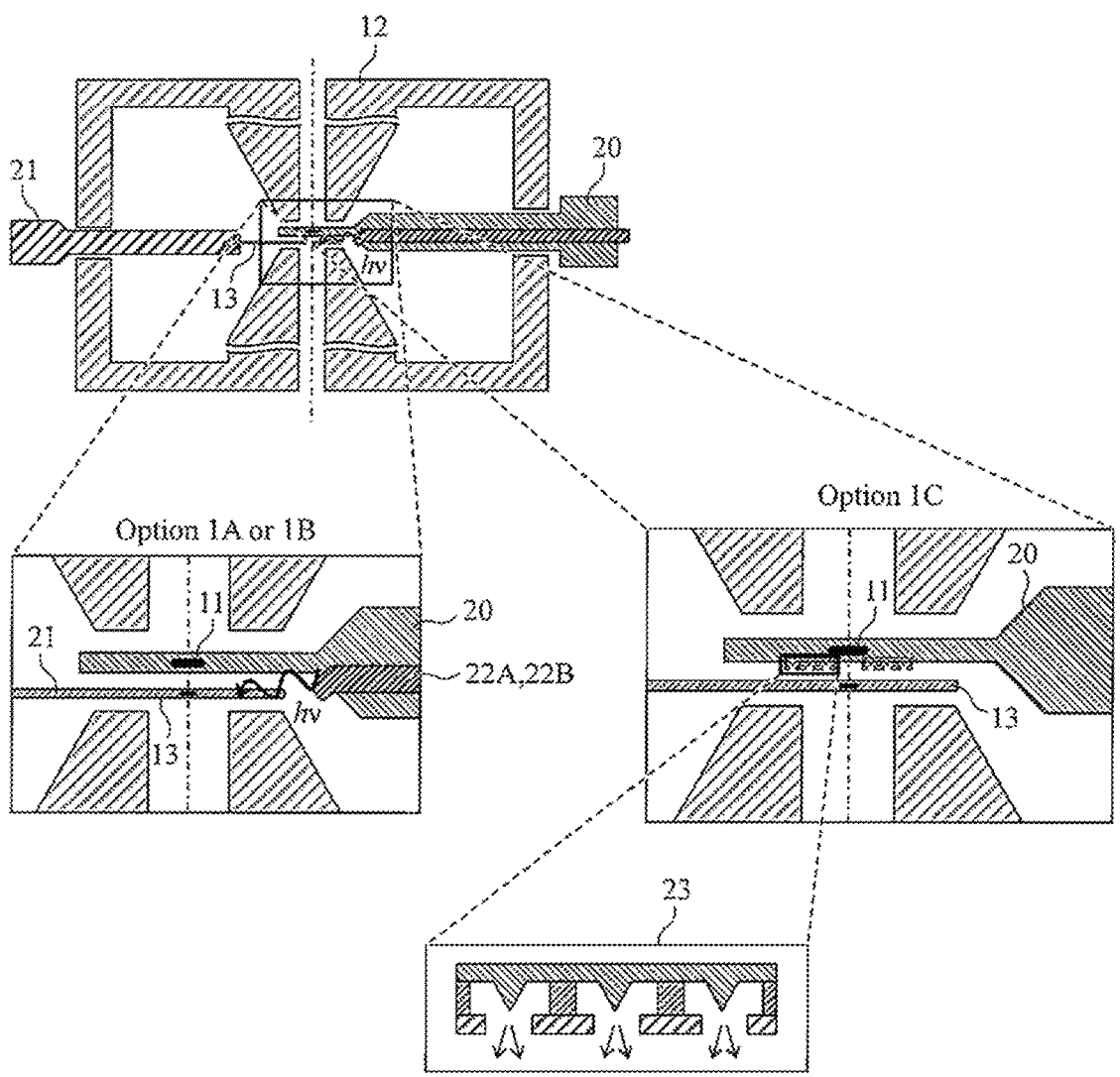
FIG. 20 is a view illustrating a method of introducing UV photons and low-energy electrons on a phase plate.

In this embodiment, a mounting example of a phase plate control system 19 will be described. FIG. 20 illustrates three mounting examples (options 1A to 1C). The option 1A is a method in which a light guide tube 22A (including an optical fiber) is buried in a sample holder 20, and photons propagating through the light guide tube 22A are guided to a phase plate 13 held by a phase plate holder 21. The option 1B is a method in which a biased drift tube 22B is buried in a sample holder 20, low-energy electrons (typically, less than 5 keV) drifting through the drift tube 22B are discharged toward a phase plate 13, and a space between a sample 11 and the phase plate 13 is filled with low-energy electrons. By using the light guide tube 22A and the drift tube 22B, the degree of freedom of the arrangement positions of a light source and an electron source can be raised. However, such a method is limited to a case in which an objective lens 12 is separate, and the magnetic field is very low. In many cases, drifting of electrons to the back focal plane 14 is disturbed by a magnetic field of the objective lens 12. The option 1C is a method in which a vacuum electric field emission electron emitter 23 is disposed on the rear face side of a sample holder 20, and electrons are discharged toward a phase plate 13. According to this configuration, electrons can be discharged to the phase plate 13 at a shorter distance.

Figure 21:
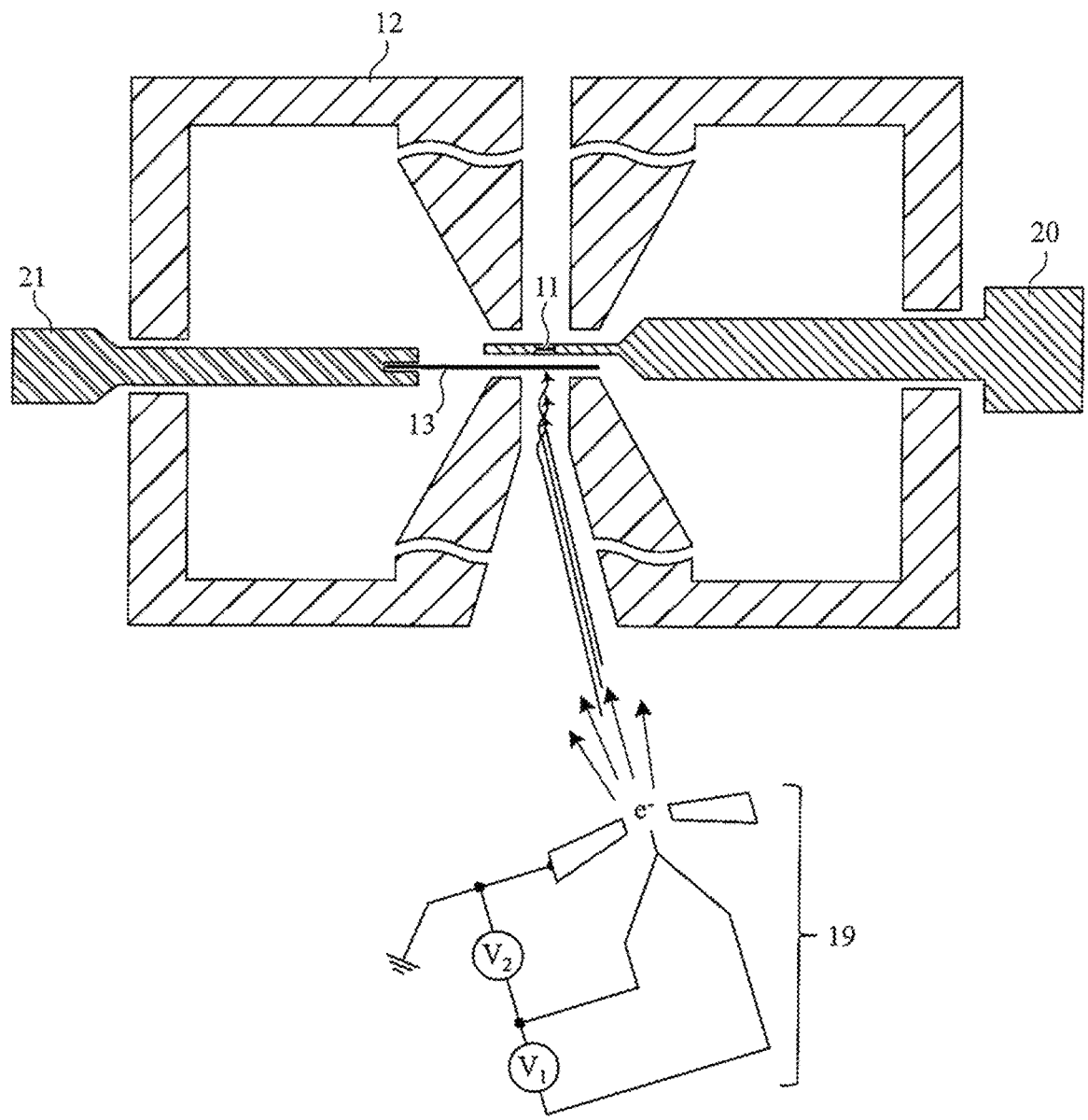
FIG. 21 is a view illustrating an example in which an electron source used for introducing electrons into a magnetic field of an objective lens is disposed below an objective diaphragm.

In addition, a mounting example illustrated in FIG. 21 can be also considered. In the case illustrated in FIG. 21, an electron source as the phase plate control system 19 is disposed on the downstream side of an objective lens 12, and electrons are radiated such that the electrons form a cloud-shaped or diverging-shaped beam on an optical axis or near the optical axis. This method illustrated in FIG. 21 has several advantages over the method illustrated in FIG. 20. First, the method illustrated in FIG. 21 has an advantage of being capable of using a relatively large discharge source of a type of the related art as a discharge source of low-energy electrons. The low-energy electrons discharged from this discharge source are transferred inside a magnetic-field free area in the direction of an optical axis. The low-energy electrons that have arrived at a strong magnetic field area (about 2 T or more) of the objective lens 12 substantially move parallel in the direction of a magnetic field and arrive at a phase plate 13. In the method illustrated in FIG. 20, although low-energy electrons can arrive at the phase plate 13 only in a case in which the magnetic field is sufficiently low, in the method illustrated in FIG. 21, low-energy electrons can arrive at the phase plate 13 even in a case in which a very strong magnetic field is present.

(8) Other Embodiments

The present invention is not limited to the embodiments described above and includes various modified examples. For example, in the embodiments described above, while the electron microscope has been described, a focused ion beam (FIB) processing device may be used instead of the electron microscope. In the case of such a device, an ion source is used instead of the electron source 3. In addition, the electron microscope described above may be a combined device using both an electron beam and a focused ion beam. The embodiments described above are described in detail for easy understanding of the invention, and thus all the described components do not necessarily need to be included. In addition, a part of a specific embodiment may be replaced with the configuration of another embodiment. Furthermore, the configuration of another embodiment may be added to the configuration of a specific embodiment. In addition, addition, removal, or replacement of a part of the configuration of another embodiment may be performs for a part of the configuration of each embodiment.

REFERENCE SIGNS LIST

1: electron microscope
2: housing (column)
3: electron source
4: cathode
5: lead-out electrode
6: anode
8: electron beam (imaging beam)
9: optical axis
10: irradiation lens
11: sample
12: objective lens
13: phase plate
14: back focal plane
15: intermediate lens
16: projection lens
17: detector
18: objective focal plane
19: phase plate control system
20: sample holder
21: phase plate holder
22A: light guide tube
22B: drift tube
23: vacuum electric field emission electron emitter
101: irradiation diaphragm
102: conjugate plane
103: diaphragm diffraction
104: diffraction lens
201: center disk
202, 204: photoconductive member
203: member
205, 206: coating
207: shield area
220: amorphous silicon film
221: island part
222, 223: conduction layer
230: center area
231: low-conductive material
232: conductive material
A1: area
A2, B2: center area
A3, B3: peripheral area
A5: outer orbit
A6: objective lens
A7: object point
A8: imaging plane
A9, A10: electron source
A11, A14: photon source
A12: conduction member
A13: support member

The invention claimed is:
1. A charged particle beam device comprising:
a first charged particle source that generates first charged particles and irradiates a sample with the generated first charged particles;
a phase plate that changes phases of the first charged particles in accordance with charged states of portions through which the first charged particles are transmitted; and
a phase plate control system that controls the charging of the phase plate, wherein the phase plate control system includes at least one of a second charged particle source generating second charged particles or a photon source generating a photon flux, and the phase plate control system controls the charging of the phase plate with irradiation of at least one of the second charged particles or the photon flux.

2. The charged particle beam device according to claim 1, wherein the phase plate includes a first area and a second area having mutually-different charging rates and causes a phase difference between the first charged particles passing through the first area and the first charged particles passing through the second area.

3. The charged particle beam device according to claim 1, wherein energy of the second charged particles and the photon flux is lower than energy of the first charged particles irradiated from the first charged particle source.

4. The charged particle beam device according to claim 1, wherein the phase plate control system includes a photon source generating UV light and controls the charging of the phase plate with irradiation of the UV light.

5. The charged particle beam device according to claim 1, wherein a thickness of a portion of the phase plate through which the first charged particles that are not scattered pass and a thickness of a portion through which the first charged particles that are scattered pass are different from each other.

6. The charged particle beam device according to claim 1, wherein the phase plate is disposed on a back focal plane, at an irradiation diaphragm position, or at an equivalent position thereof.

7. The charged particle beam device according to claim 1, wherein the phase plate control system includes at least one of a drift tube guiding second charged particles to the phase plate or a light guide tube guiding a photon flux to the phase plate.

8. The charged particle beam device according to claim 1, wherein the phase plate control system is a vacuum electric field emission electron emitter that is mounted on a rear face side of a sample holder holding the sample.

9. The charged particle beam device according to claim 1, wherein the phase plate control system is disposed on a downstream side of an objective lens.

10. A phase plate comprising:

a phase plate that changes phases of first charged particles to be irradiated to a sample from a charged particle source in accordance with charged states of portions through which the first charged particles are transmitted;

a member of an incomplete conductor; and a second member, wherein the second member is one of a conduction member or a photoconductive member.

11. The phase plate according to claim 10, comprising:

a first area and a second area having mutually-different charging rates.

12. The phase plate according to claim 11, wherein the second member is the conduction member, and the first area is formed with the member of the incomplete conductor surrounded by the conduction member, and the second area is formed with a member surrounding the periphery of the first area with the conduction member interposed therebetween.

13. The phase plate according to claim 10, comprising:

wherein the second member is the conduction member, and the member of the incomplete conductor is surrounded by the conduction member.

14. The phase plate according to claim 10:

wherein the second member is the photoconductive member, and the member of the incomplete conductor connected to a support member through the photoconductive member.

15. The phase plate according to claim 10:

wherein the second member is the conduction member, and at least a part of the member of the incomplete conductor is coated with the photoconductive member.

16. A phase plate, comprising:

a phase plate that changes phases of first charged particles to be irradiated to a sample from a charged particle source in accordance with charged states of portions through which the first charged particles are transmitted;

a substrate formed of a first material;

an island part formed in a part of the substrate using a second material different from the first material; and a conduction layer covering surfaces of the substrate and the island part.

* * * * *